United States Patent [19]

Fujimori et al.

[11] Patent Number: 4,974,226
[45] Date of Patent: Nov. 27, 1990

[54] CIRCUIT FOR TESTING INTEGRATED CIRCUITS

[75] Inventors: Kumiko Fujimori; Hirofumi Shinohara, both of Hyogo, Japan

[73] Assignee: Mitsubishi Denki Kabushiki Kaisha, Tokyo, Japan

[21] Appl. No.: 247,288

[22] Filed: Sep. 22, 1988

[30] Foreign Application Priority Data

Sep. 25, 1987 [JP] Japan ................................ 62-242321

[51] Int. Cl.$^5$ ........................................... G01R 31/28
[52] U.S. Cl. ................................. 371/22.3; 371/22.6; 371/25.1
[58] Field of Search .................... 371/22.3, 22.4, 22.5, 371/22.6, 22.1, 25.1, 27, 21.2, 21.1, 15.1; 324/73 R, 73 AT

[56] References Cited

U.S. PATENT DOCUMENTS

| | | | |
|---|---|---|---|
| 4,534,028 | 8/1985 | Trischler | 371/22.3 |
| 4,775,977 | 10/1988 | Dehara | 371/27 |
| 4,827,476 | 5/1989 | Garcia | 371/22.3 |

OTHER PUBLICATIONS

"Gate Level Self-Test for Field-Replaceable Unit", *IBM Technical Disclosure Bulletin*, vol. 28, No. 11, pp. 4766-4767 (Apr. 1986).
"ROS combined with LSSD SRL Circuit for Fast Logic Testing", *IBM Technical Disclosure Bulletin*, vol. 30, No. 2, pp. 944-945 (Jul. 1988).
"Built-in Self Testing of Embedded Memories" by Sunil K. Jain and Charles E. Stroud, *IEEE TEST AND DESIGN*, pp. 27-37 (Oct. 1986).
T. Chan et al "Advanced Structured Arrays Combine High Density Memories with Channel-Free Logic Array" IEEE 1987 Custom Integrated Circuits Conference (Jul. 1987): 39, 43.
E. Eichelberger and T. Williams, "A Logic Design Structure for LSI Testability" The Proceedings of the 14th Design Automation Conference, 1977, IEEE (Reprint): 462, 468.

*Primary Examiner*—Jerry Smith
*Assistant Examiner*—Robert W. Beausoliel
*Attorney, Agent, or Firm*—Lowe, Price, LeBlanc, Becker & Shur

[57] ABSTRACT

Test data stored in a data register 13a are applied to a data generator 11a and compared with a 1 bit signal stored in a scan latch 1c to determine the coincidence or non-coincidence therebetween. Outputs from the data generator 11a are applied to RAM 10 to be written in a designated region in a memory cell array 6. Data read from the said region of the memory cell array 6 are compared with expected value data in a comparator 12. Thus, the collation of data is carried out.

21 Claims, 6 Drawing Sheets

CIRCUIT FOR TESTING INTEGRATED CIRCUITS

BACKGROUND OF THE INVENTION

1. Field of the Invention

The present invention relates to circuits for testing integrated circuits and, more specifically, to a circuit provided on the same chip as the integrated circuit for testing functional blocks included in the integrated circuit.

2. Description of the Prior Art

FIG. 1 is a schematic diagram of a LSI constituted by a composite functional block comprising a RAM 10, a control circuit 15 and an arithmetic unit 16. A scan path (data path) is employed to facilitate testing in this LSI. The scan path 17 is provided between an input terminal X0 and an output terminal Y0 and used for testing the RAM 10. The scan path 18 is provided between an input terminal X1 and an output terminal Y1 and used for testing the control circuit 15 and the arithmetic unit 16 as well as the RAM 10.

FIG. 2 shows details of the portion 19 in FIG. 1. FIG. 2 shows a memory cell array 6 of 4 bit×M words structure as an example. On the scan path 17 successively arranged are scan latch 1a comprising multistages of latches for holding row address signals; a scan latch 1b comprising two stages of latches for holding a $\overline{CE}$ (chip enable) signal and a $\overline{WE}$ (write enable) signal; a scan latch 28 comprising four stages of latches 1f for holding 4 bit test data; and a scan latch 29 constituted by four stages of latches 1f for holding 4 bit output data from the memory cell array 6. The address buffer 2 receives row address signals written in the scan latch 1a. The row decoder 3 receives outputs from the address buffer 2. The outputs from the row decoder 3 are inputted to the memory cell array 6.

The control circuit 5 receives signals written in the scan latch 1b. The outputs of the control circuit 5 are inputted in the address buffer 2, the column decoder 4 and in a Din buffer (data input buffer) 8. The Din buffer 8 receives outputs from the scan latch 28. A Do buffer (data output buffer) 9 receives read outputs from the memory cell array 6 through a multiplexer 7. The outputs from the Do buffer 9 are written in the scan latch 29 in bit by bit correspondence. The multiplexer 7 selects one of a plurality of columns in the memory cell array 6 based on the signal from the column decoder 4 to input test data from the Din buffer 8 to the memory cell array 6 and receives output from the memory cell array 6 to transmit the same to the Do buffer 9. A strobe 14 is to extract outputs from the Do buffer 9 at a constant timing.

The operation will be described in the following. First, test data, a $\overline{CE}$ signal, a $\overline{WE}$ signal and a row address signal are successively inputted in this order to the scan path 17 from the terminal X0. Now, each of the scan latches 1a, 1b, 28 and 29 is constituted by latches interposed in series in association with the scan path 17, so that every time a signal or the test data is inputted, the signal or the data which is already being inputted in any one stage of latch in each of the scan latches 1a, 1b, 28 and 29 is shifted to the latch in the succeeding stage, and a new signal or data is written in the latch of preceding stage. When the row address signal, $\overline{CE}$ signal, $\overline{WE}$ signal and 4 bit (the number of bits of the memory cell array 6 to be tested) test data are inputted, the writing is completed.

The row address signal written in the scan latch 1a is supplied to the row decoder 3 through the address buffer 2. Therefore, the row decoder 3 selects one row out of the rows in the memory cell array 6. The $\overline{CE}$ signal and the $\overline{WE}$ signal written in the scan latch 1b are applied to the control circuit 5. The control circuit 5 controls the driving of the address buffer 2, the column decoder 4, Din buffer 8 and the Do buffer 9. After the selection of the memory cell array 6 is carried out in this manner, the 4 bit test data written in the scan latch 28 are read out to be written in the memory cell at the selected position in the memory cell array 6 through the Din buffer 8. The 4 bit test data written in the memory cell array 6 are read through the multiplexer 7 and the Do buffer, and written in the scan latch 29 in bit by bit correspondence. The test data written in the scan latches 28 and 29 in this manner are read one by one from the output terminal Y0. The collation of the data read from the scan latches 28 and 29 is carried out in another circuit, not shown. Meanwhile, the output data from the Do buffer 9 is sampled at a designated timing by using the strobe 14.

As described above, in a conventional circuit a plurality of scan latches are arranged in series, with the data inputted and outputted one by one successively to and from each of the latches. Therefore, the input and output of the row address signal, $\overline{CE}$ signal, $\overline{WE}$ signal and test data whose number is equal to the bit number of the integrated circuit to be tested should be carried out to complete the test of one word. Consequently, there is a disadvantage that a long time is required for inputting and outputting signals and test data. In addition, the input and output of the test data and the collation thereof should be done by separate circuits in the conventional circuit, with the time for collation further elongating the time for testing.

SUMMARY OF THE INVENTION

One object of the present invention is to provide a circuit for testing integrated circuits capable of greatly reducing time required for one testing compared with a conventional circuit.

Another object of the present invention is to reduce the number of bits of the data inputted and outputted for testing.

A further object of the present invention is to enable collation of the data inputted to functional blocks with the data outputted from the functional blocks in the chip.

A still further object of the present invention is to enable changing of bit patterns of the test data without rewriting the stored test data.

A still further object of the present invention is to enable changing of the bit patterns of the expected value data without rewriting the stored expected value data.

Briefly stated, in the present invention, test data generating means and expected value data generating means are provided independently from a data path to which data required for testing functional blocks are inputted, the test data generated by the test data generating means are inputted to the functional block, and the collation of the data outputted from the functional block with the expected value data generated by the expected value data generating means is carried out by determining means provided in the chip.

In another aspect of the present invention, the bit pattern of the test data outputted from a data register is changed by pattern changing means.

In a further aspect of the present invention, the bit pattern of the expected value data outputted from the data register is changed by the pattern changing means.

According to the present invention, there is no need to input test data to be applied to the functional blocks to the data path, the number of bits of the input/output data to and from the data path can be reduced, whereby the time required for inputting and outputting data can be reduced. Therefore, time required for one testing can be reduced.

In addition, according to the present invention, the collation of data can be carried out in the chip without externally outputting the data inputted to the functional block and the data outputted from the functional block, whereby the time required for the collation of data can be reduced. Therefore, the time required for one testing can be reduced.

According to the present invention, the bit pattern of the test data can be changed without rewiring the stored test data, whereby various tests can be carried out by test data of one type. Therefore, the trouble of rewriting test data every time the type of the test is changed can be avoided.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
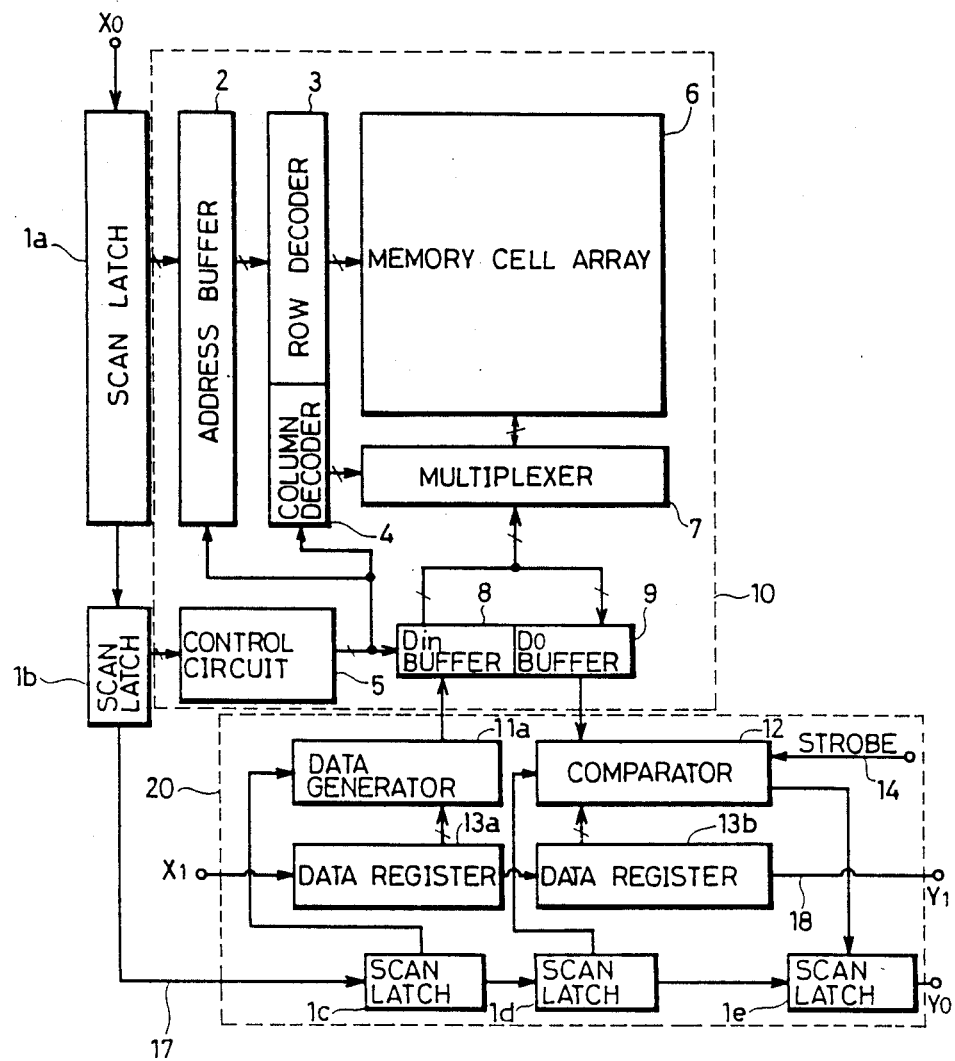
FIG. 3 is a block diagram of a circuit for testing in accordance with one embodiment of the present invention.

FIG. 3 is a block diagram of a circuit for testing a rewritable memory of 4 bit×M word structure in accordance with one embodiment of the present invention.

Figure 2:
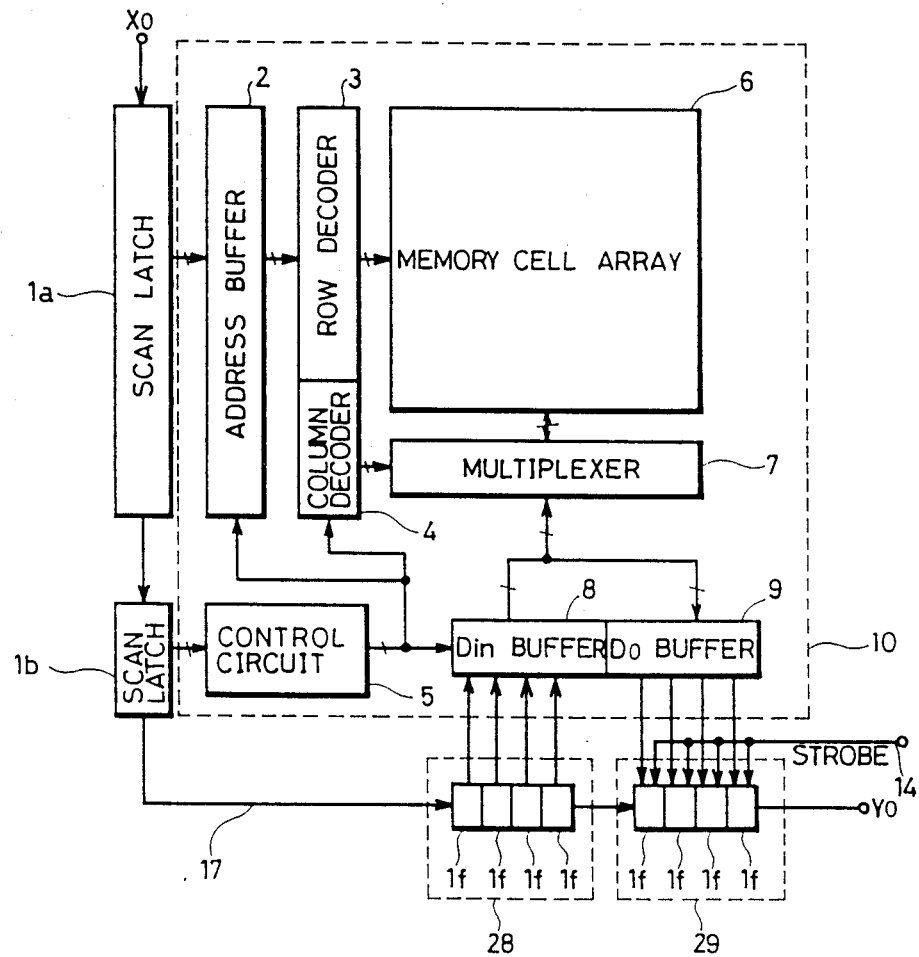
FIG. 2 is a block diagram showing details of a portion 19 in FIG. 1.

The structure of a portion surrounded by a dotted line 20 is different from that of a conventional circuit in FIG. 2. Therefore, in FIG. 3, the same portions as FIG. 2 are denoted by the same reference numerals and the detailed description thereof will be omitted. In the following, the structure of the portion 20 will be described in detail. The structure shown in FIG. 3 is formed on one semiconductor chip.

Figure 1:
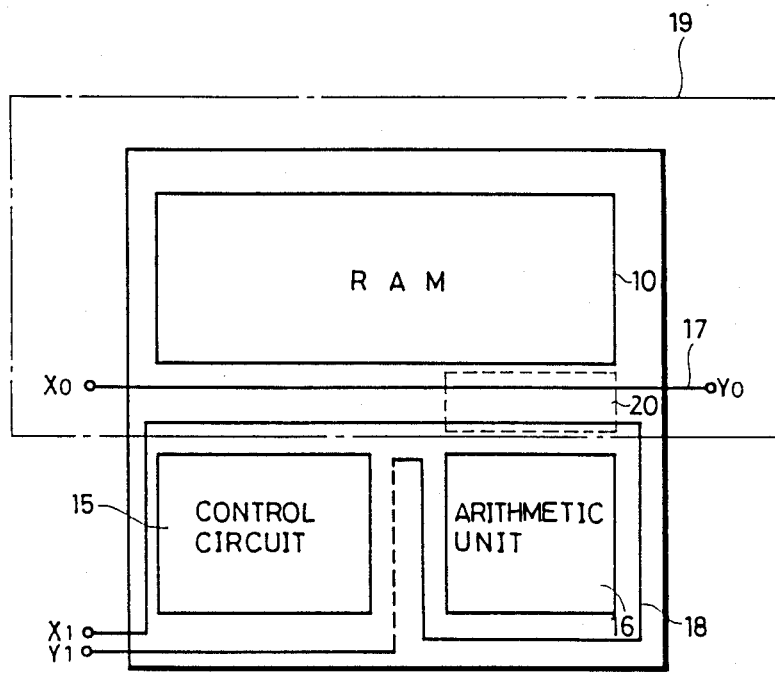
FIG. 1 is a schematic diagram of a conventional LSI having a composite functional block.

On the scan path 17, scan latches 1c, 1d and 1e each comprising one stage of a latch are arranged continuous to the conventional scan latches 1a and 1b. Meanwhile, another scan path 18 provided between an input terminal X1 and an output terminal Y1 is to test other functional blocks (for example the control circuit 16 and the arithmetic unit 16 shown in FIG. 1). Data registers 13a and 13b are arranged on a portion of the scan path 18. 4 bit test data for testing the memory cell array 6 are written in the data registers 13a and 13b. Therefore, in this embodiment, the scan path 18 is commonly used for testing the memory cell array 6. The data generator 11a receives outputs from the scan latch 1c and from the data register 13a and generates 4 bit test data which should be actually written in the memory cell array. Outputs from the data generator 11a are applied to the Din buffer 8. The comparator 12 receives outputs from the scan latch 1d, the data register 13b and the Do buffer 9. The comparator 12 generates the same data as those from the data generator 11a based on the outputs from the scan latch 1d and from the data register 13b and compares the data with the outputs from the Do buffer 9. Outputs from the comparator 12 are outputted to the output terminal Y0 through the scan latch 1e.

Figure 4:
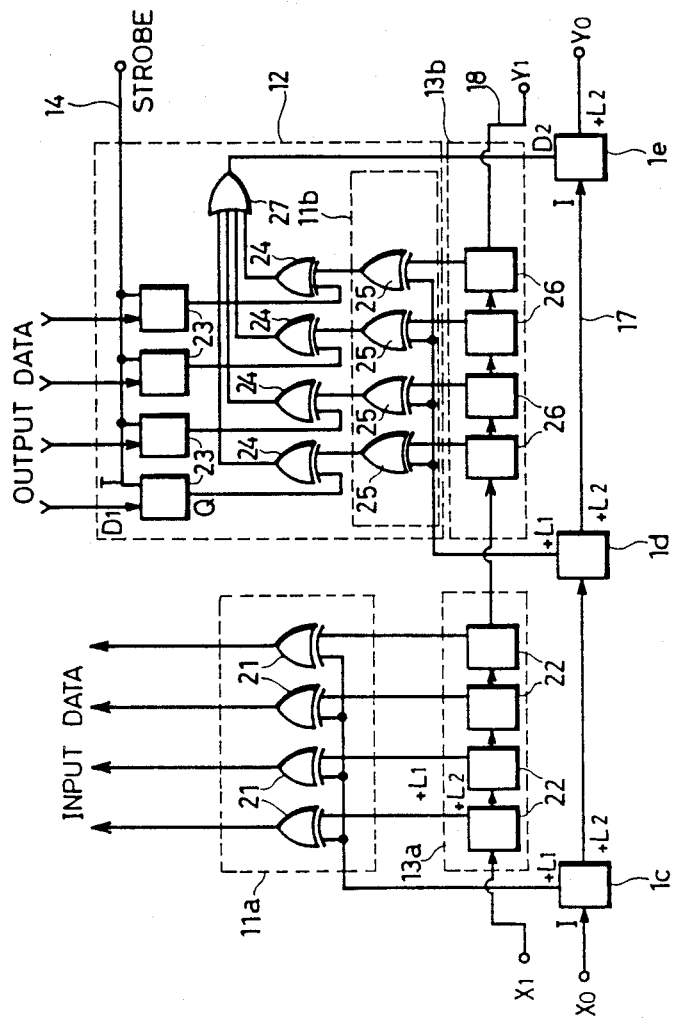
FIG. 4 shows details of a portion 20 in FIG. 2.

FIG. 4 shows a detailed structure of the portion 20 in FIG. 2. In the figure, the data registers 13a and 13b are constituted by four stages of latches 22 and 26 arranged on the scan path 18, respectively. The data generator 11a is constituted by for exclusive OR gates 21. An output from the scan latch 1c is applied to one input of each of the exclusive OR gates 21. To the other input end of each of the exclusive OR gates, outputs of corresponding bits are applied from the four stages of latches 22 in the data register 13a. Outputs of the exclusive OR gates 21 are applied to the Din buffer 8 and written in the memory cell array 6.

The expected value generator 11b in the comparator 12 is constituted by four exclusive OR gates 25. An output from the scan latch 1d is commonly applied to one input end of each of the exclusive OR gates 25, and an output of the corresponding bit from four stages of latches 26 in the data register 13b is applied to the other input of each of the gates. The outputs from the exclusive OR gates 25 are applied to one input end of each of four exclusive OR gates 24. An output of the corresponding bit from four stages of latches 23 latching outputs of the Do buffer 9 is applied to the other input end of each of the exclusive OR gates 24. Outputs from the exclusive OR gates 24 are applied to the scan latch 1c through the OR gate 27. A strobe 14 is applied to each of the latches 23. The strobe 14 is to extract outputs from the Do buffer 9 at a prescribed timing.

Figure 5:
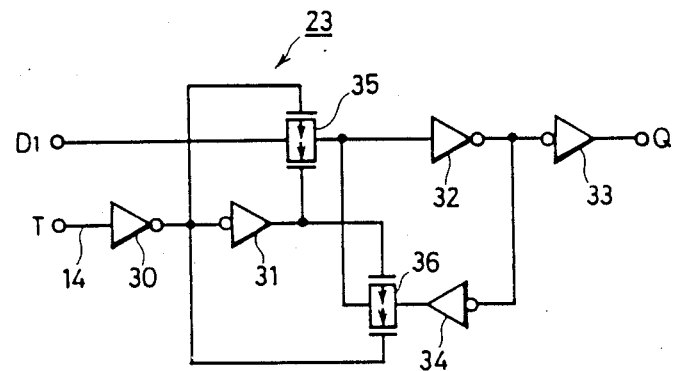
FIG. 5 is a logic circuit diagram showing detailed structure of a latch 23 shown in FIG. 4.

FIG. 5 is a logic circuit diagram showing a detailed structure of the latch 23 shown in FIG. 4. As is shown in the figure, the latch 23 comprises inverters 30 to 34 and CMOS transmission gates 35 and 36. Outputs from the Do buffer are applied to the input terminal D1 while a strobe 14 is applied to the input terminal T. Outputs to be applied to the exclusive OR gates 24 are obtained at the output terminal Q.

Figure 6A:
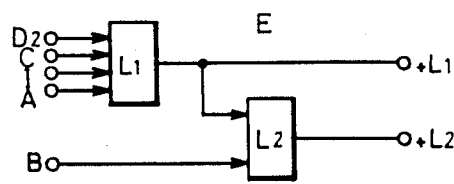
FIG. 6A shows a schematic diagram showing structure of one stage of latch included in each of the scan latches 1a to 1e of FIG. 3.

FIG. 6A shows a schematic structure of one stage of latches included in each of the scan latches 1a to 1e. As is shown in the figure, the latch E comprises a first logic circuit L1 and a second logic circuit L2.

Figure 6B:
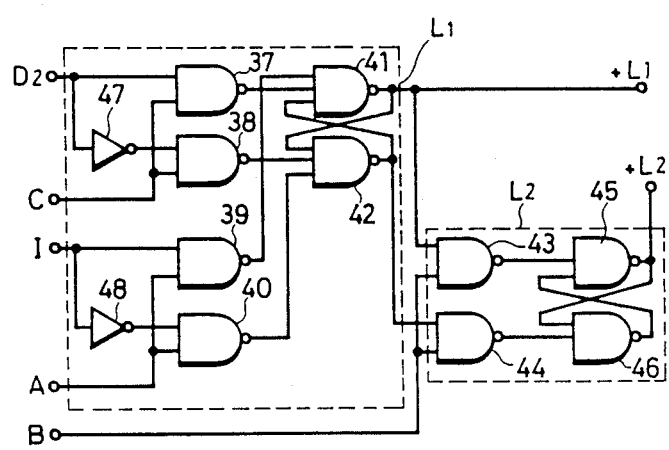
FIG. 6B is a logic circuit diagram showing detailed structure of the latch E in FIG. 6A.

FIG. 6B is a logic circuit diagram showing a detailed structure of the latch E shown in FIG. 6A. As is shown in the figure, the first logic circuit L1 comprises inverters 47 and 48 and NAND gates 37 to 42. The second logic circuit L2 comprises NAND gates 43 to 46. The latch E is selectively operated in a system operation or in a shift operation mode. In the system operation, it latches data by the clock signal C. Meanwhile, if it is operating in the shift operation mode, it latches the data I by the clock signal A and outputs (+L2) the data I by the clock signal B. The first logic circuit L1 has the function of holding data as well as selecting the system operation or the shift operation mode, and the logic circuit outputs a signal +L1. The second logic circuit L2 has the function of holding and outputting data in the shift operation mode and it outputs a signal +L2.

Figure 7:
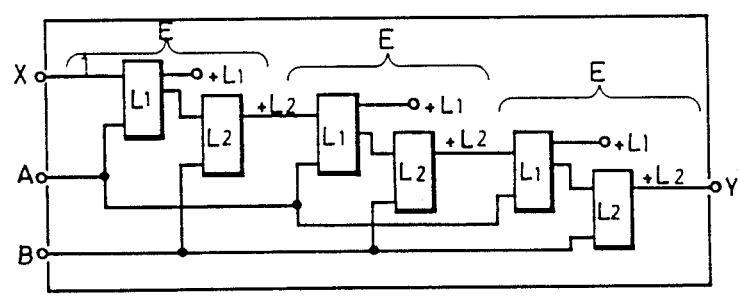
FIG. 7 shows an example of connection of three stages of latches E.

An example of connection of three stages of latches E is shown in FIG. 7 as a reference.

The operation of the above embodiment will be described in the following. The operation of the portions other than the portion 20 is the same as the prior art.

The data 0 is commonly written in the scan latches 1c and 1d by the scan input from the terminal X0. Meanwhile, test data for the control circuit 15 and an arithmetic unit 16 are inputted from the terminal X1 to the scan path 18, with the data to be inputted to the data registers 13a and 13b out of the data for testing the RAM inserted thereinto. Therefore, the same 4 bit test data and the 4 bit expected value data are inputted beforehand in the data registers 13a and 13b from the terminal X1 through the scan path 18. The test data are inputted to the exclusive OR gate 21 in the data generator 11a which is in bit by bit correspondence. The data from the scan latch 1c are commonly inputted to the exclusive OR gates 21. Outputs from the data generator 11a are written in the memory cell array 6 in bit by bit correspondence through the Din buffer 8 as the test data.

The data read from the memory cell array 6 together with the expected value data outputted from the exclusive OR gates 25 in the expected value generator 11b are inputted to the exclusive OR gates 24 in the succeeding stage in bit by bit correspondence in the same manner as the input data generating process, and the coincidence or non-coincidence therebetween is determined. Outputs representing the result of determination are inputted to an OR gate 27. The OR gate 27 correctively output all results of testing. More specifically, in a rewritable memory, the input and output data are independent from each other. Therefore, if the memory cell array 6 operates properly, the inputted test data and the output data will be the same provided that the test data belongs to the same group during a series of test period. If one or more bit in the read test data does not coincide with the expected value data, not all bits of the outputs from the exclusive OR gate 24 become 0, so that the OR gates 27 outputs the data 1. If all bits of the read data coincide with the expected value data, the OR gate 27 outputs the data 0. The collation of the input and output data can be carried out in this manner by the exclusive OR gate 24, with the result of collation provided from the OR gate 24.

By arranging four stages of latches 23 in bit by bit correspondence in the preceding stage of the exclusive OR gates 24 and by inputting a strobe 14 to the scan latch 23, the output data from the memory cell array 6 can be extracted at a desired timing.

In the present embodiment, when the data 0 is written in the scan latches 1c and 1d, test data [0000] is written in each latch 22 in the data register 13a and the expected value data [0000] is written in each latch 26 in the data register 13b, outputs from the data generator 11a and from the expected value generator 11b will be both [0000]. Thereafter, when the data 0 written in the scan latches 1c and 1d is replaced with the data 1, outputs from the data generator 11a and from the expected value generator 11b will be [1111], providing inverted data. Therefore, the test data can be changed without rewriting the contents of the data registers 13a and 13b.

Although the testing circuit is employed for the 4 bit×M word writable memory in the above described embodiment, it can be employed for other writable memories that the 4 bit input type.

The present invention may be applied not only to the memory cell array but also arithmetic unit and control circuits provided that they are implemented in semiconductor integrated circuits containing functional circuits of plural bits. In that case, the expected output data of the arithmetic unit or the control circuits should be written in the comparator 13b.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. In an integrated circuit comprising a functional block with N (N is an integer no less than 2) bit inputs, a separate circuit provided on the same chip as said integrated circuit for testing said functional block, comprising:
   a data path (17) to which control data for testing said functional block is applied;
   a plurality of latch means (1a to 1e) external from said functional block, cascade connected on said data path for storing said control data external to said functional block for testing said functional block;
   test data generating means (13a and 11a) for receiving said control data stored in said plurality of latch means and, in response, generating N bit test data for input to said functional block;
   expected value data generating means (13b and 11b) for generating N bit expected value data for comparison with resultant data output from said functional block in correspondence with said N bit test data input to said functional block; and
   determining means (24) for comparing every corresponding bit of said resultant data outputted from said functional block with said N bit expected value data for determining coincidence or non-coincidence thereof.

2. A testing circuit according to claim 1, wherein said test data generating means comprises a first data register (13a) for storing said N bit test data, and said expected value data generating means comprises a second data register (13b) for storing said N bit expected value data.

3. In an integrated circuit comprising a functional block with N (N is an integer no less than 2) bit inputs, a circuit provided on the same chip as said integrated circuit for testing said functional block, comprising:
   a data path (17) to which control data for testing said functional block is applied;
   a plurality of latch means (1a to 1 e) cascade connected on said data path for storing said control data for testing;
   test data generating mans (13a and 11a) for generating N bit test data for input to said functional block, said test data generating means including a first data register (13a) for storing N bit test data and first pattern changing means (11a) for changing a bit pattern of output data from said first data register responsive to an applied logic signal;

expected value data generating means (13b and 11b) for generating N bit expected value data for comparison with resultant data output from said functional block in correspondence with said N bit test data input to said functional block, said expected value data generating means including a second data register (13b) for storing said N bit expected value data and second pattern changing means (11b) for changing a bit pattern of output data from said second data register responsive to an applied logic signal; and determining means (24) for comparing every corresponding bit of said resultant data outputted from said functional block with said N bit expected value data for determining coincidence or non-coincidence thereof.

4. A testing circuit according to claim 3, wherein said plurality of latch means comprise a latch circuit (1c) for storing the logic signal to be applied to said first pattern changing means, and a latch circuit (1d) for storing the logic signal to be applied to said second pattern changing means.

5. A testing circuit according to claim 4, wherein said first and second pattern changing means comprise a plurality (N) of exclusive OR gates (21 and 25) each provided for every bit.

6. In an integrated circuit comprising a functional block with N (N is an integer no less than 2) bit inputs, a circuit provided on the same chip as said integrated circuit for testing said functional block, comprising:

a first data path (17) to which control data for testing said functional block is applied;

a second data path (18) different from said first data path (17) for providing test data to, and resultant data from, said functional block;

a plurality of latch means (1a to 1e) cascade connected on said first data path for storing said control data for testing;

test data generating means (13a to 11a) for generating N bit test data for input to said functional block, said test data generating means including a first data register (13a) provided on said second data path (18) for storing N bit test data and first pattern changing means (11a) for changing a bit pattern of output data from said first data register responsive to an applied logic signal;

expected value data generating means (13b and 11b) for generating N bit expected value data for comparison with resultant data output from said functional block in correspondence with said N bit test data input to said functional block, said expected value data generating means including a second data register (13b) provided on said second data path (18) for storing said N bit expected value data and second pattern changing means (11b) for changing a bit pattern of output data from said second data register responsive to an applied logic signal; and determining means (24) for comparing every corresponding bit of said resultant data outputted from said functional block with said N bit expected value data for determining coincidence or non-coincidence thereof.

7. A testing circuit according to claim 6, wherein said second data path is a data path provided for testing another functional block.

8. In an integrated circuit comprising a functional block with N (N is an integer no less than 2) bit inputs, a circuit provided on the same chip as said integrated circuit for testing said functional block, comprising:

a data path (17) to which control data for testing said functional block is applied;

a plurality of latch means (1a to 1e) cascade connected on said data path for storing said control data for testing;

test data generating means (13a and 11a) for generating N bit test data for input to said functional block;

expected value data generating means (13b and 11b) for generating N bit expected value data for comparison with resultant data output from said functional block in correspondence with said N bit test data input to said functional block; and determining means (24) including a plurality (N) of exclusive OR gates each for comparing a respective correspondence bit of said resultant data outputted from said functional block with respective ones of said N bit expected value data for determining coincidence or non-coincidence thereof.

9. A testing circuit according to claim 8, further comprising an OR gate (27) for outputting OR of said a plurality (N) of exclusive OR gates included in said determining means.

10. In an integrated circuit comprising a functional block with N (N is an integer no less than 2) bit inputs, a circuit provided on the same chip as said integrated circuit for testing said functional block, comprising:

a data path (17) to which control data for testing said functional block is applied;

a plurality of latch means (1a to 1e) cascade connected on said data path for storing said control data for testing;

test data generating mans (13a and 11a) for generating N bit test data for input to said functional block;

expected value data generating means (13b and 11b) for generating N bit expected value data for comparison with resultant data output from said functional block in correspondence with said N bit test data input to said functional block; and determining means (24) for comparing every corresponding bit of said resultant data outputted from said functional block with said N bit expected value data for determining coincidence or non-coincidence thereof, wherein said functional block to be tested is a rewritable memory (100) of N bits×M words (M is a positive integer).

11. In an integrated circuit comprising a functional block (10, 15 and 16) with N (N is an integer no less than 2) bit input, a circuit provided on the same chip as said integrated circuit for testing said functional block, comprising:

a data path (17) to which data required for testing said functional block are inputted;

a plurality of latch means (1a to 1e) cascade connected on said data path for holding said data required for testing; and test data generating means (13a and 11a) for generating N bit test data to be inputted to said functional block; wherein said test data generating means comprises
a data register (13a) for storing said N bit test data, and
pattern changing means (11a) for changing a bit pattern of output data of said data register based on an applied logic signal; and said plurality of latch means comprises a latch circuit (1c) for storing the logic signal to be applied to said pattern changing means.

12. A testing circuit according to claim 11, wherein said pattern changing means comprises a plurality (N) of exclusive OR gates 21 each provided for every bit.

13. A testing circuit according to claim 11, wherein said data register is provided on another data path (18) different from said data path (17).

14. A testing circuit according to claim 13, wherein said another data path is provided for testing another functional block.

15. In an integrated circuit comprising a functional block (10, 15 and 16) with N (N is an integer no less than 2) bit input, a circuit provided on the same chip as said integrated circuit for testing said functional block, comprising:
a data path (17) to which data required for testing said functional block are inputted;
a plurality of latch means (1a to 1e) cascade connected on said data path for holding said data required for testing;
expected value data generating means (13b and 11b) for generating N bit expected value data; and
determining means (24) for comparing every corresponding bit of the N bit data outputted from said functional block with said N bit expected value data to determine coincidence or non-coincidence therebetween; wherein
said expected value generating means comprises
a data register (13b) for storing N bit expected value data, and
pattern changing means (11b) for changing a bit pattern of output data of said data register based on an applied logic signal; and
said plurality of latch means comprises a latch circuit (1c) for storing the logic signal to be applied to said pattern changing means.

16. A testing circuit according to claim 15, wherein said pattern changing means comprises N exclusive OR gates (25) provided for every bit.

17. A testing circuit according to claim 16, further comprising an OR gates for outputting OR of said N exclusive OR gates included in said determining means.

18. A testing circuit according to claim 15, wherein said determining means comprises N exclusive OR gates (24) provided for every bit.

19. A testing circuit according to claim 15, wherein said data register is provided on another data path (18) different from said data path (17).

20. A testing circuit according to claim 19, wherein said another data path is a data path provided for testing another functional block.

21. In an integrated circuit comprising a functional block with N (N is an integer no less than 2) bit inputs, a circuit provided on the same chip as said integrated circuit for testing said functional block, comprising:
a first data path (17) receiving control data for testing said functional block;
a second data path (18) for providing test data to, and resultant data from, said functional block;
a plurality of latch means (1a to 1e) cascade connected on said first data path for storing said control data for testing;
test data generating means (13a and 11a) connected on said second data path for generating N bit test data for input to said functional block;
expected value data generating means (13b and 11b) connected on said second data path for generating N bit expected value data for comparison with resultant data output from said functional block in correspondence with said N bit test data input to said functional block; and
determining means (24) for comparing every corresponding bit of said resultant data outputted from said functional block with said N bit expected value data for determining coincidence or non-coincidence thereof.

* * * * *